(12) United States Patent
Hanafi et al.

(10) Patent No.: US 6,660,598 B2
(45) Date of Patent: Dec. 9, 2003

(54) METHOD OF FORMING A FULLY-DEPLETED SOI (SILICON-ON-INSULATOR) MOSFET HAVING A THINNED CHANNEL REGION

(75) Inventors: Hussein I. Hanafi, Basking Ridge, NJ (US); Diane C. Boyd, LaGrangeville, NY (US); Kevin K. Chan, Staten Island, NY (US); Wesley Natzle, New Paltz, NY (US); Leathen Shi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 10/084,550

(22) Filed: Feb. 26, 2002

(65) Prior Publication Data

US 2003/0162358 A1 Aug. 28, 2003

(51) Int. Cl.$^7$ ............................................. H01L 21/336
(52) U.S. Cl. ..................... 438/291; 438/289; 438/301
(58) Field of Search ................... 438/151, 282, 438/287, 291, 433, 595, 655

(56) References Cited

U.S. PATENT DOCUMENTS

| | | |
|---|---|---|
| 4,825,267 A | 4/1989 | Maas |
| 4,921,814 A | 5/1990 | Ishikawa et al. |
| 5,300,447 A | 4/1994 | Anderson |
| 5,322,526 A | 6/1994 | Nakamura et al. |
| 5,387,528 A | 2/1995 | Hutchings et al. |
| 5,447,907 A | 9/1995 | Nakamura et al. |
| 5,488,005 A | 1/1996 | Han et al. |
| 5,557,126 A | 9/1996 | Cunningham |
| 5,747,356 A * | 5/1998 | Lee et al. ............. 438/282 |
| 5,814,544 A | 9/1998 | Huang |
| 5,856,225 A * | 1/1999 | Lee et al. ............. 438/291 |
| 5,883,399 A | 3/1999 | Yin et al. |
| 5,904,541 A | 5/1999 | Rho et al. |
| 6,010,921 A | 1/2000 | Soutome |
| 6,093,947 A | 7/2000 | Hanafi et al. |
| 6,121,077 A | 9/2000 | Hu et al. |
| 6,225,173 B1 | 5/2001 | Yu |

* cited by examiner

*Primary Examiner*—D Le
(74) *Attorney, Agent, or Firm*—Scully, Scott, Murphy & Presser; Wan Yee Cheung

(57) ABSTRACT

A sub-0.05 μm channel length fully-depleted SOI MOSFET device having low source and drain resistance and minimal overlap capacitance and a method of fabricating the same are provided. In accordance with the method of the present invention, at least one dummy gate region is first formed atop an SOI layer. The dummy gate region includes at least a sacrificial polysilicon region and first nitride spacers located on sidewalls of the sacrificial polysilicon region. Next, an oxide layer that is coplanar with an upper surface of the dummy gate region is formed and then the sacrificial polysilicon region is removed to expose a portion of the SOI layer. A thinned device channel region is formed in the exposed portion of the SOI layer and thereafter inner nitride spacers are formed on exposed walls of the fist nitride spacers. Next, a gate region is formed over the thinned device channel region and then the oxide layer is removed so as to expose thicker portions of the SOI layer than de device channel region.

10 Claims, 21 Drawing Sheets

METHOD OF FORMING A FULLY-DEPLETED SOI ( SILICON-ON-INSULATOR) MOSFET HAVING A THINNED CHANNEL REGION

FIELD OF THE INVENTION

The present invention relates to semiconductor devices, and more particularly to sub-0.05 µm fully-depleted silicon-on-insulator (SOI) metal oxide semiconductor field effect transistor (MOSFET) devices having a relatively low source and drain resistance and minimal overlap capacitance. The present invention also relates to various methods of fabricating such fully-depleted SOI MOSFET devices.

BACKGROUND OF THE INVENTION

Over the past twenty-five years or so, the primary challenge of very large scale integration (VLSI) has been the integration of an ever-increasing number of metal oxide semiconductor field effect transistor (MOSFET) devices with high yield and reliability. This was achieved mainly in the prior art by scaling down the MOSFET channel length without excessive short-channel effects. As is known to those skilled in the art, short-channel effects are the decrease of threshold voltage V, in short-channel devices due to two-dimensional electrostatic charge sharing between the gate and the source/drain diffusion regions.

In recent years, and as channel lengths are being scaled below 0.1 µm, SOI complementary metal oxide semiconductor (CMOS) technology has received considerable interest in VLSI for its potential low-voltage, low-power, and high-speed advantages in comparison to bulk CMOS devices. As known to those skilled in the art, SOI structures include an insulating layer, i.e., buried oxide region (BOX), that electrically isolates a top Si-containing layer from a bottom Si-containing layer. The top Si-containing, i.e., the SOI layer, serves as the area in which electronic devices such as MOSFETs can be fabricated.

Thin film SOI MOSFETs in which the top Si-containing layer has a thickness of about 20 nm or less are of special interest due to improved isolation, reduced parasitic capacitance as well as the reduction of short-channel and floating body effects that can be obtained from such technology. Despite the known advantages with thin film SOI technology, processing challenges exist which substantially hamper the use of thin film SOI MOSFETs in semiconductor integrated circuits. For example, prior art processes for fabricating thin film SOI MOSFETs have difficulty in forming a thin (20 nm or less) SOI channel region, while simultaneously being able to maintain abutting thick SOI source and drain regions. Thick source and drain regions are desirable since they permit the formation of a low sheet resistance silicide layer.

In view of the above-mentioned drawbacks with fabricating prior art thin SOI MOSFETs, there exists a need for providing a new and improved method for fabricating SOI MOSFETs which have a thin SOI device channel region, i.e., a recessed channel, as well as thick SOI source and drain regions abutting the thin channel region.

SUMMARY OF THE INVENTION

The present invention provides a technique for the fabrication of sub-0.05 µm channel length fully-depleted SOI MOSFET devices that exhibit excellent short-channel effects, low source and drain resistance and minimal overlap capacitance. The inventive technique utilizes a damascene-gate process which allows self-aligned thinning of a top Si-containing layer (i.e., SOI layer) of an SOI structure in the channel region to minimize short-channel effects while simultaneously maintaining thick SOI source and drain regions to permit formation of a low sheet resistance silicide layer. By utilizing a thin nitride layer deposition technique during the inventive method to form thin inner nitride spacers in the structure, the overlap capacitance between the gate and the source and drain regions is minimized.

Specifically, the method of the present invention which is capable of forming sub-0.05 µm channel length fully-depleted SOI MOSFET devices comprises the steps of:

forming at least one dummy gate region atop an SOI layer, said dummy gate region comprising at least a sacrificial polysilicon region and first nitride spacers located on sidewalls of said sacrificial polysilicon region;

forming an oxide layer that is coplanar with an upper surface of said dummy gate region;

removing said sacrificial polysilicon region to expose a portion of the SOI layer;

forming a thinned device channel region in said exposed portion of the SOI layer;

forming inner nitride spacers on exposed walls of said first nitride spacers;

forming a gate region (including gate dielectric and gate conductor) over said thinned device channel region; and removing said oxide layer so as to expose thicker portions of said SOI layer than said device channel region.

In one embodiment of the present invention, various implants such as extension implants, halo implants, and source/drain implants are performed after the oxide layer has been removed.

In yet another embodiment of the present invention, the various implants are performed during formation of the dummy gate region.

Following the removal of the oxide layer from the structure which exposes the thick SOI regions abutting the thinned device channel region, the present invention contemplates forming salicide regions in the thick SOI regions; or forming an epi Si layer; or forming an epi layer and thereafter a salicide layer.

Another aspect of the present invention relates to a sub-0.05 µm channel length fully-depleted SOI MOSFET device which is fabricated using the processing steps of the present invention. Specifically, the sub-0.05 µm channel length fully-depleted SOI MOSFET comprises an SOI layer having a channel region of a first thickness and abutting source/drain regions of a second thickness present therein, wherein said second thickness is greater than said first thickness and said source/drain regions have a salicide layer present thereon; and at least one gate region present atop said SOI layer.

DETAILED DESCRIPTION OF THE INVENTION

Figure 1:
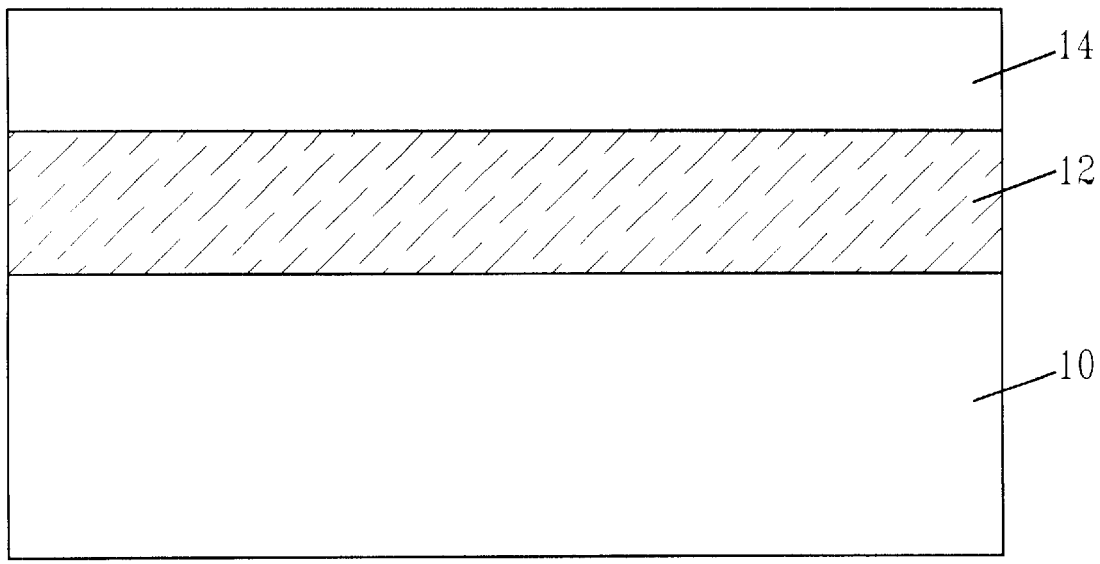
FIGS. 1–13 are cross-sectional views showing the various processing steps which are employed in one embodiment of the present invention.

The present invention, which provides sub-0.05 µm channel length fully-depleted SOI MOSFETs and methods for fabricating the same, will now be described in greater detail by referring to the drawings that accompany the present application.

The first embodiment of the present invention (See, FIGS. 1–13), in which the source/drain regions as well as the halo implant regions and the extension implant regions are formed after the gate region has been fabricated in the structure will be described first. The second embodiment of the present invention (See, FIGS. 14–23) wherein the various implant regions are formed in the SOI layer prior to formation of the gate region will be described later.

Reference is first made to FIG. 1 which illustrates an initial SOI structure that can be employed in the present invention. Specifically, the SOI structure shown in FIG. 1 comprises bottom Si-containing layer 10, i.e., the Si-containing substrate, insulating layer 12 present atop bottom Si-containing layer 10, and top Si-containing layer 14 present atop the surface of insulating layer 12. The term "Si-containing layer" as used herein denotes a material such as Si, SiGe, SiGeC, SiC and other like Si-containing materials. The insulating layer is typically a buried oxide region.

The SOI structure shown in FIG. 1 is fabricated using techniques well known to those a skilled in the art. For example, the SOI structure illustrated in FIG. 1 may be formed by a thermal bonding process, or alternatively, the SOI structure may be formed by an oxygen implantation process which is referred to in the art as a separation by implantation of oxygen (SIMOX) process.

The top Si-containing layer of the SOI structure (hereinafter SOI layer 14) may have a variable initial thickness depending upon the technique used in forming the same. Typically, SOI layer 14 has an initial vertical thickness of from about 10 to about 250 nm, with an initial thickness of from about 25 to about 50 nm being more highly preferred. The thickness of the underlying insulating layer 12 and bottom Si-containing layer 10 is not critical to the present invention.

Figure 2:
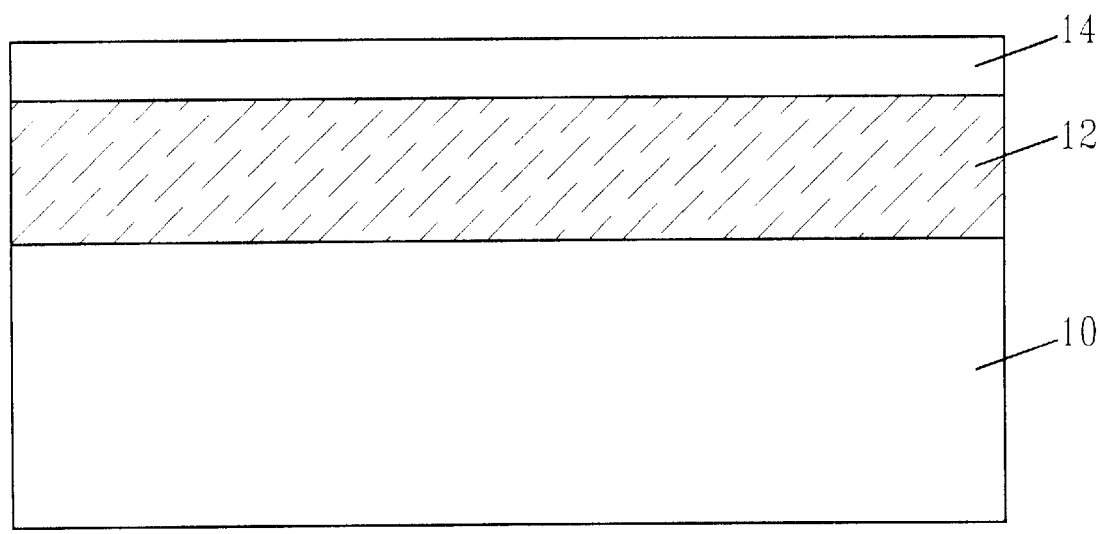
Figure 3:
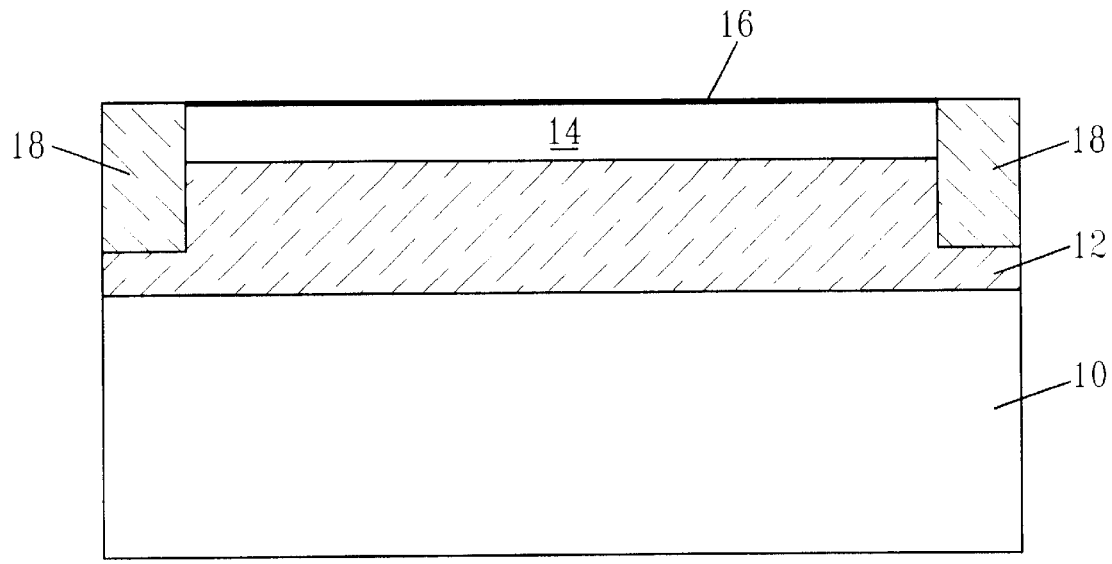

In some instances, and especially when the SOI layer has an initial thickness of greater than 50 nm, it may be necessary to thin SOI layer 14 from its initial thickness to a predetermined thickness that is about 50 nm or less. This optional thinning step of the present invention, which results in the structure shown in FIG. 2, is carried out using processing steps well known to those skilled in the art. (For example, the SOI layer may be thinned by chemical-mechanical polishing (CMP), grinding or a combination of thermal oxidation and etching. When thermal oxidation and etching are employed to thin SOI layer 14, the etching step may be carried out using wet etching, such as HF, or any conventional dry etching process such as reactive ion etching, ion beam etching or plasma-etching may be employed.

Next, a pad oxide layer (labeled as element 16 in FIG. 3), is formed atop SOI layer 14 by using a conventional thermal oxidation process. Alternatively, pad oxide layer 16 may be formed by a deposition process, such as chemical vapor deposition (CVD), plasma-assisted CVD, evaporation, or chemical solution deposition. Pad oxide layer 16 formed at this point of the inventive process is a thin oxide layer having a thickness of from about 6 to about 15 nm.

Trench isolation regions 18 (See, FIG. 3) are then formed in the SOI structure by utilizing lithography and etching. The lithographic step employed in the present invention includes applying a photoresist (not shown) to surface of pad oxide layer 16; exposing the photoresist to a pattern of radiation (in the present case a trench pattern is formed); and developing the pattern into the photoresist by utilizing a conventional resist developer. The etching step, which is used to transfer the trench pattern into the pad oxide layer and the SOI structure, includes any conventional dry etching process such as reactive-ion etching, ion beam etching, plasma etching, laser ablation or any combination thereof. A single etching process ray be employed, or alternatively, more than one etching process may be employed to form trenches in the SOI structure.

After trenches have been formed in the SOI structure, the trenches are filled with a trench dielectric material such as high-density plasma (HDP) oxide or TEOS (tetraethylorthosilicate) using conventional deposition processes well known to those skilled in the art. In some embodiments of the present invention, the walls of the trenches are lined with a liner material, such as $SiO_2$ or $Si_3N_4$, prior to filling with the trench fill material. After the filling process, a conventional planarization process and/or densification may be performed on the structure.

Figure 4:
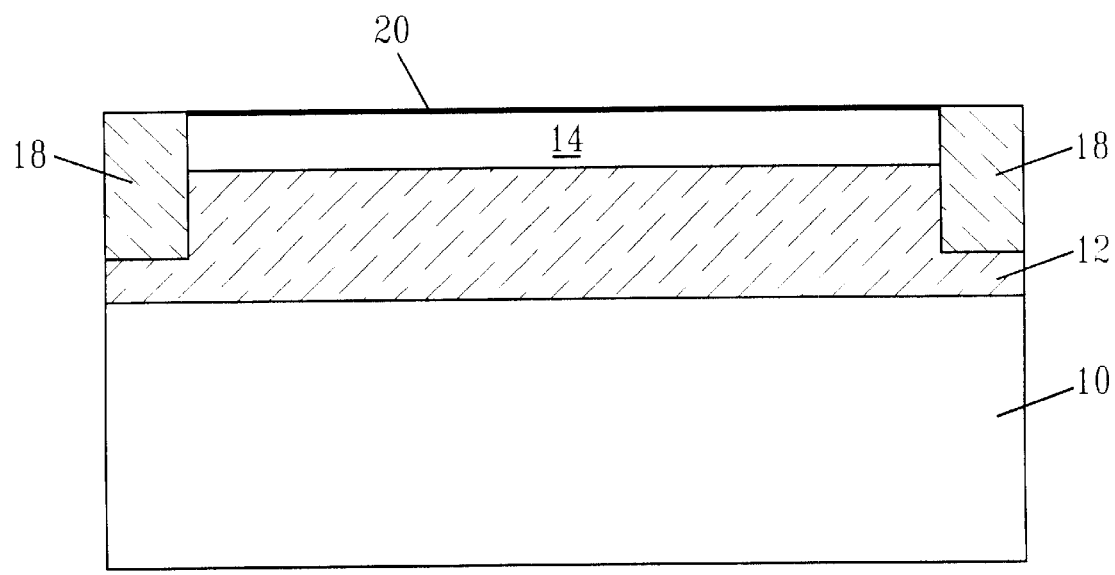
Figure 5:
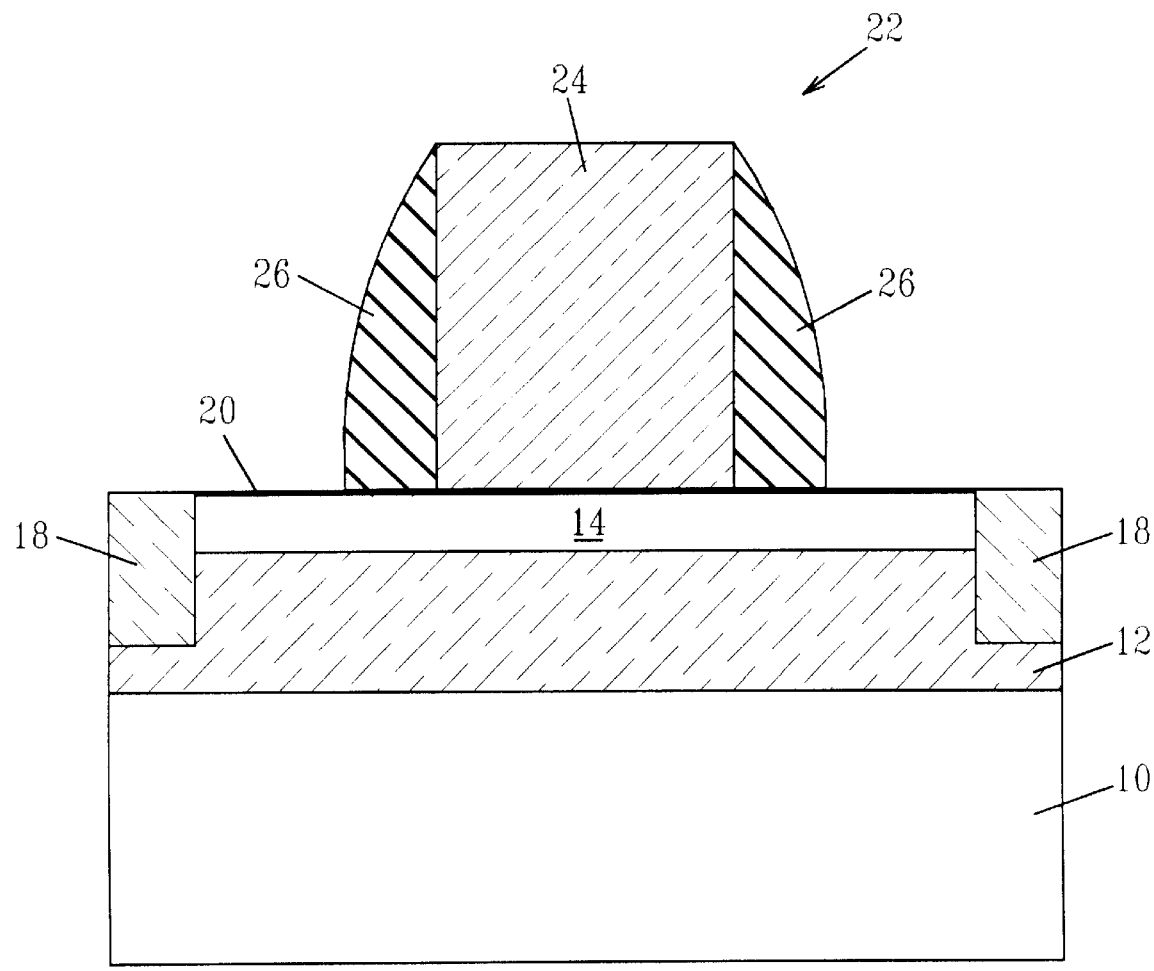
Figure 6:
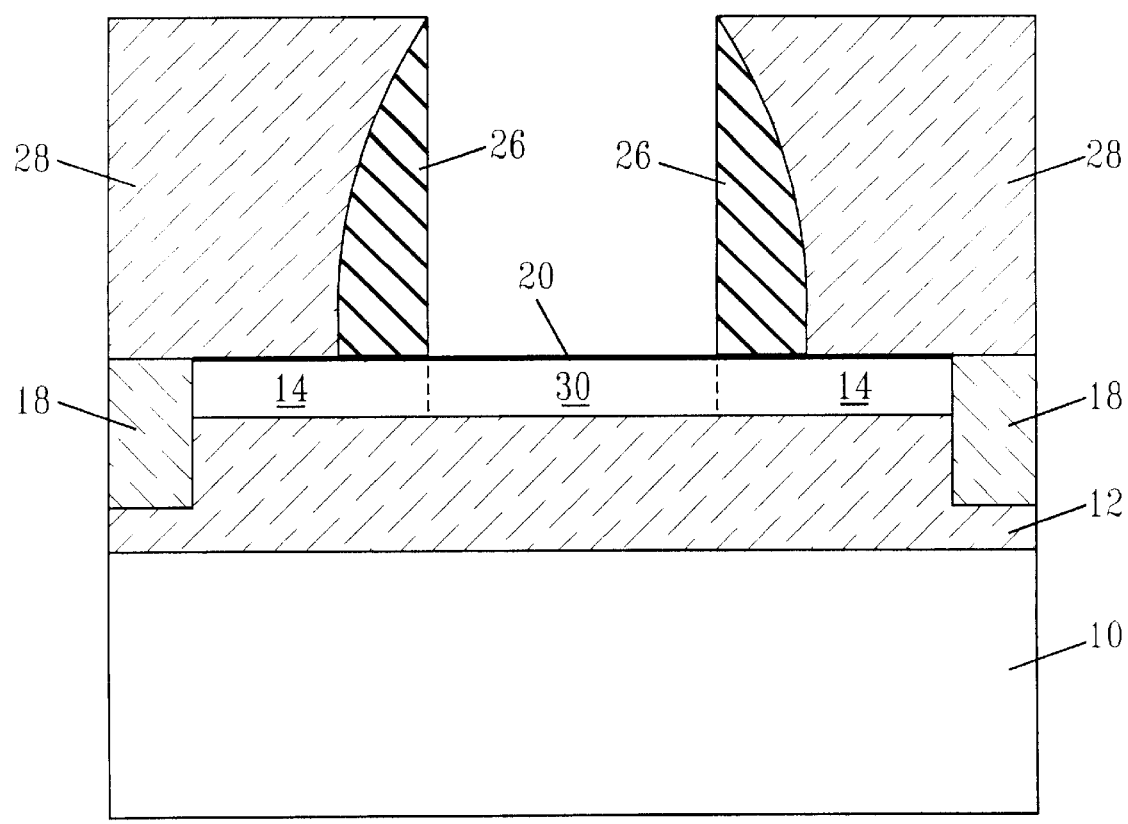
Figure 7:
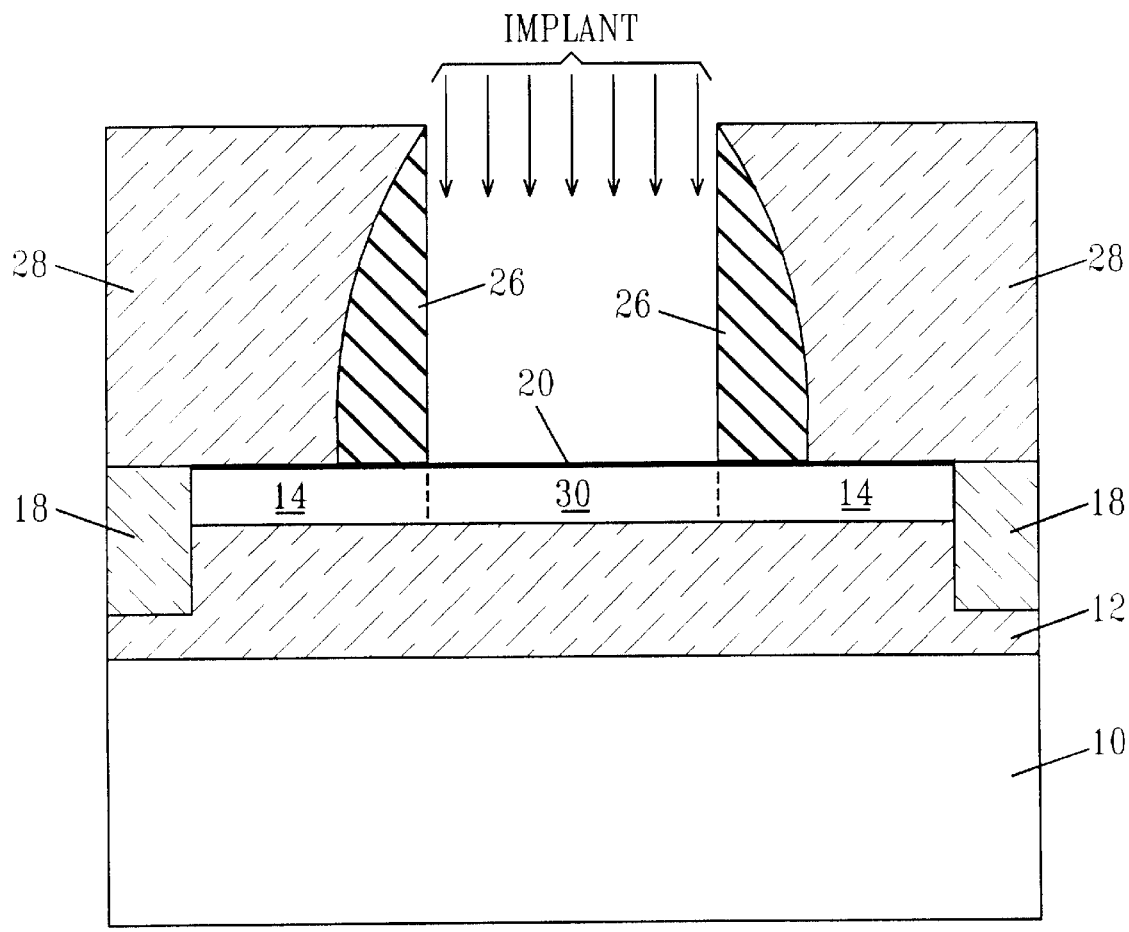

Next, and as illustrated in FIG. 4, pad oxide layer 16 is removed from the surface of SOI layer 14 using a stripping process that is highly selective in removing oxide and thereafter sacrificial oxide layer 20 is formed on the SOI layer utilizing a conventional thermal oxidation process. Sacrificial oxide layer 20 formed at this point of the inventive process has a thickness of from about 3 to about 20 nm, with a thickness of from about 3 to about 6 nm being highly preferred. Note that the sacrificial oxide layer is grown substantially over the SOI layer, not atop trench isolation region 18.

Dummy gate region 22 comprising sacrificial polysilicon region 24 and nitride spacers 26 is then formed atop portions of the sacrificial oxide layer. Note that the nitride spacers are formed on exposed vertical sidewalls of the sacrificial polysilicon region. The dummy gate region is formed by first providing a sacrificial polysilicon layer atop the sacrificial oxide layer. The sacrificial polysilicon layer is then patterned by lithography and etching. Nitride spacers 26 are then formed by deposition and etching. The resultant structure including the dummy gate region atop the SOI structure is shown, for example, in FIG. 5.

It should be noted that the present invention is not limited to forming just a single dummy gate region atop the SOI structure. Instead, the present invention works equally well when a plurality of dummy gate regions are formed atop the SOI structure. The formation of a plurality of dummy gate regions will allow for the formation of a plurality of MOSFETs across portions of the SOI structure.

After dummy gate formation, oxide layer 28 such as high-density plasma (HDP) oxide or TEOS is deposited and planarized so as to be coplanar with an upper surface of dummy gate region 22. Next, sacrificial polysilicon region 24 of dummy gate region 22 is removed from the structure using chemical downstream etching or KOH stopping atop sacrificial oxide layer 20. The resultant structure that is formed after these steps have been performed is shown, for example, in FIG. 6. Note that the inner edges of nitride spacers 26 define the length of device channel 30.

At this point of the inventive method, device channel (i.e., body region) 30 may be optionally subjected to ion implantation and annealing using conditions that are well known to those skilled in the art. For example, the device channel may be ion implanted with a p-type dopant using any ion dosage such 1E12 to about 5E13 atoms/cm$^3$ and annealed at any conditions such as, for example, 1000° C., for 5 seconds in Ar. The structure showing the optional ion implanting into device channel 30 is shown, for example, in FIG. 7.

Figure 8:
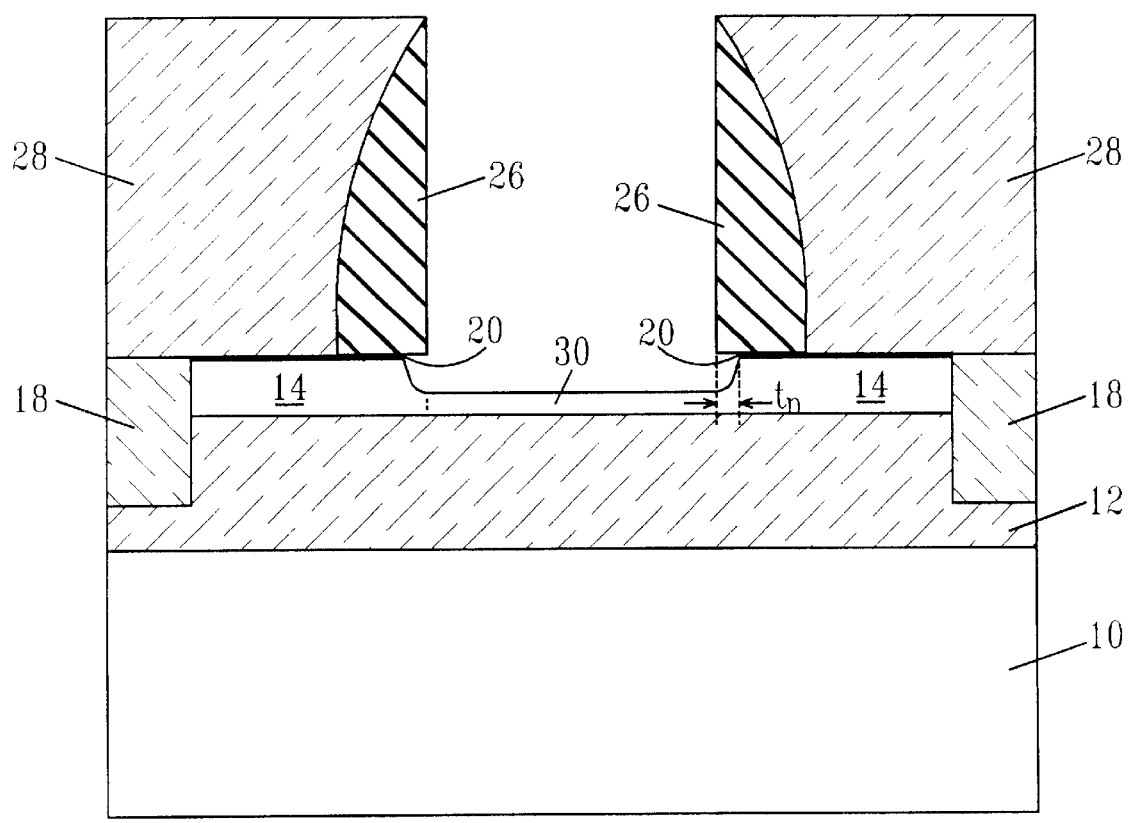

Device channel 30 is then thinned to a thickness that is less than the thickness of the abutting SOI layer. Typically, the device channel is thinned to a thickness of from about 10 to about 20 nm at this point of the inventive process. The resultant structure including the thinned device channel, i.e., recessed channel, is illustrated in FIG. 8. The thinning of the device channel may be performed using chemical downstream etching, reactive-ion etching or a combination of thermal oxidation and etching. The latter technique may be repeated any number of times.

Figure 9:
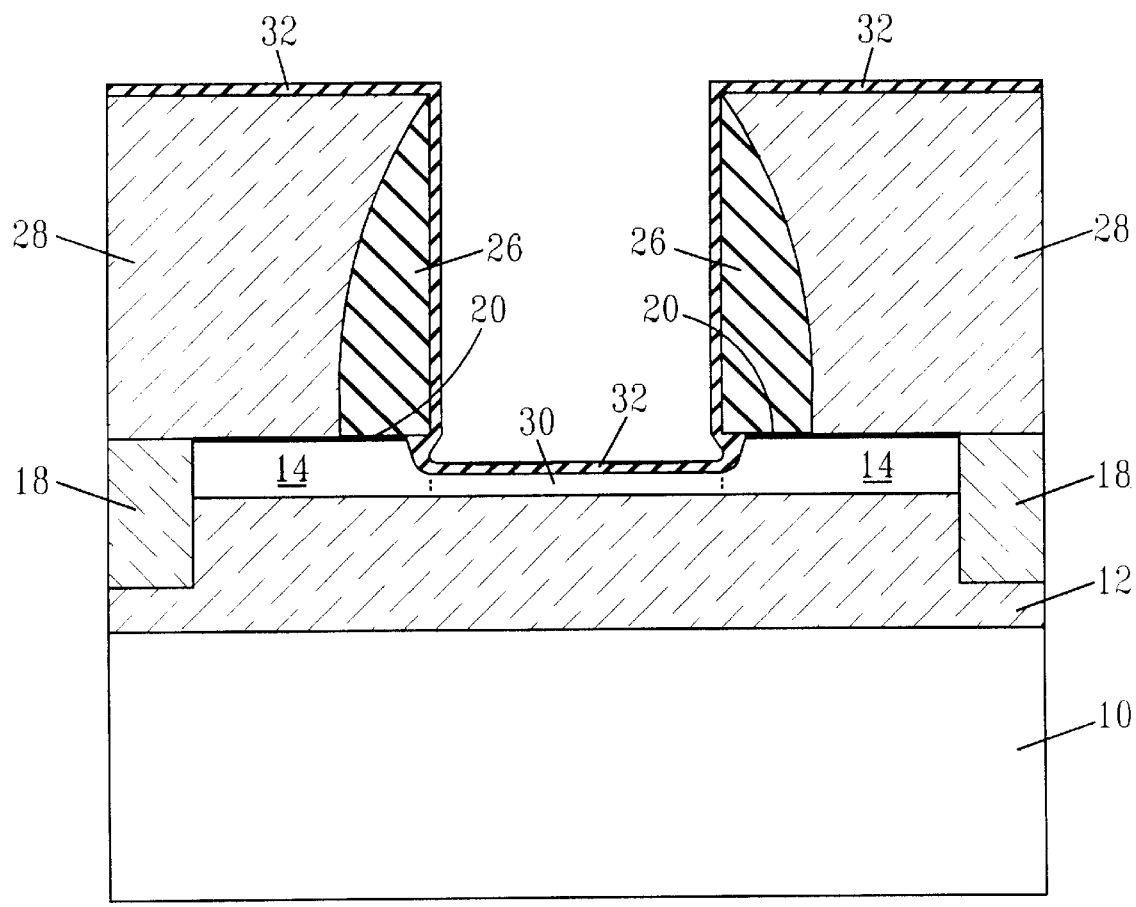
Figure 10:
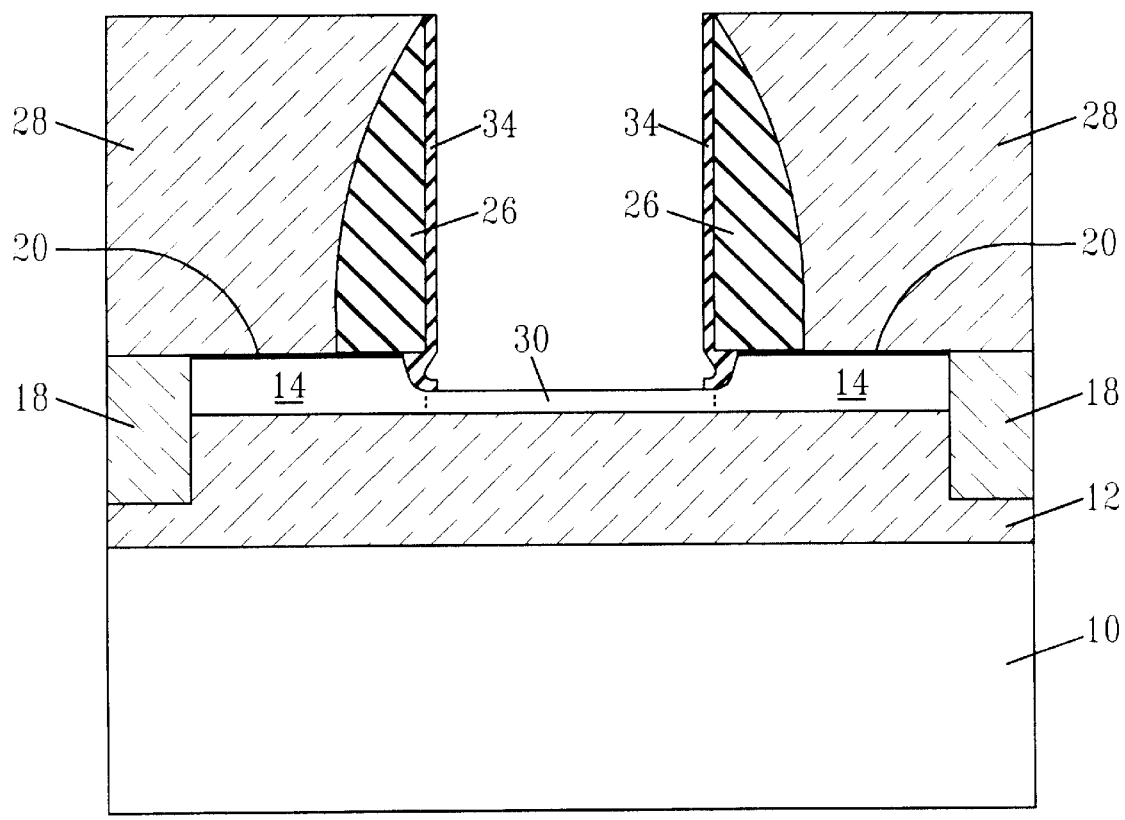
Figure 11:
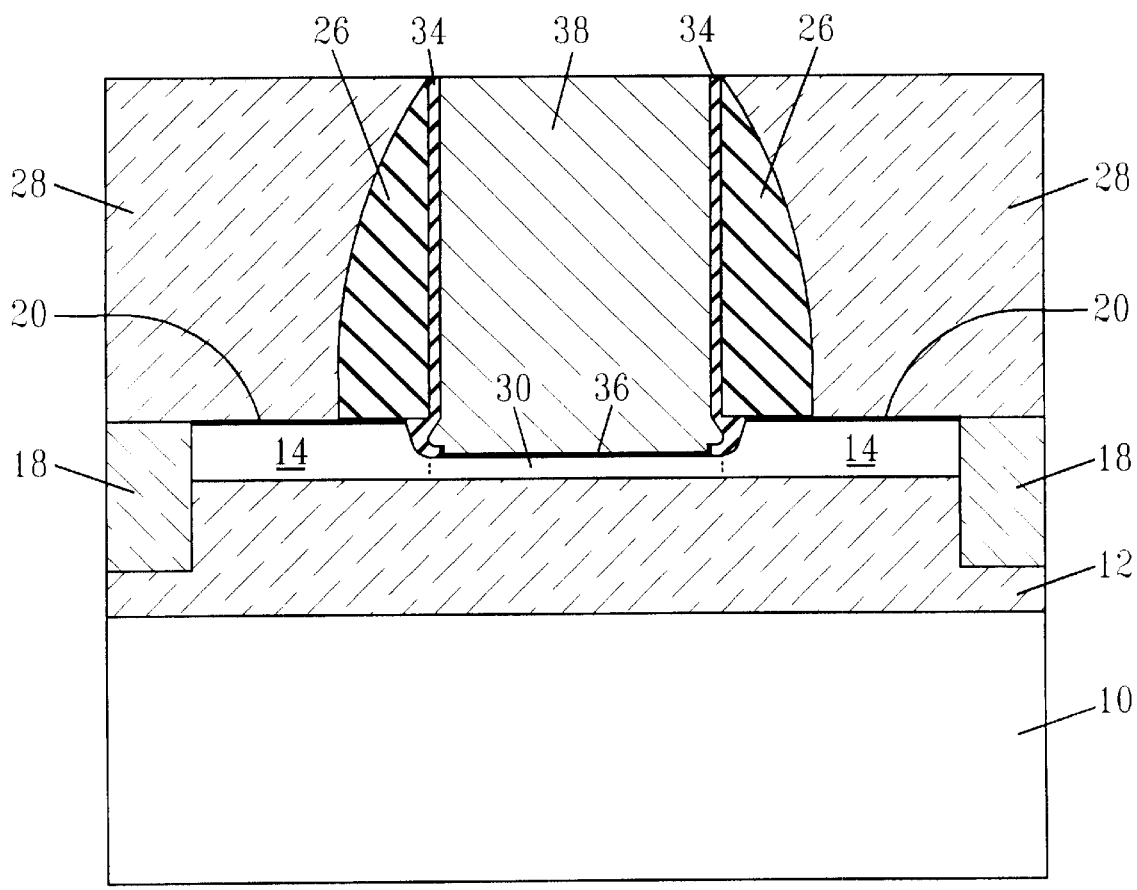

FIG. 9 shows the structure after nitride liner 32 has been deposited on the exposed horizontal and vertical surfaces of the structure shown in FIG. 8; and FIG. 10 shows the resultant structure after the nitride liner has been removed from the horizontal surfaces forming nitride inner spacers 34. Note that nitride inner spacers 34 are substantially thinner than nitride spacers 26.

After forming the nitride inner spacers, the exposed surface of thinned device channel region 30 is subjected to a thermal oxidation process and thereafter a chemical oxide removal (COR) process that is carried out at relatively low pressures (6 millitorr or less) in a vapor of HF and $NH_3$ is performed. This step of the present invention removes any damages that may have been previously introduced into the thinned device channel region by the inventive process. Note that the structure that is formed after oxidation and COR is substantially the same as that which is shown in FIG. 10.

Next, gate dielectric 36 is formed atop the thinned device channel region utilizing a conventional deposition process. Alternatively, gate dielectric 36 may be formed by a thermal oxidation, nitridation or oxynitridation process. Combinations of the aforementioned processes may also be used in forming the gate dielectric. The gate dielectric may be composed of any conventional dielectric including, but not limited to: $SiO_2$; $Si_3N_4$; SiON; temperature sensitive high-k dielectrics such as $TiO_2$, $Al_2O_3$, $ZrO_2$, $HfO_2$, $Ta_2O_5$, $La_2O_3$; and other like oxides including perovskite-type oxides. Gate dielectric 36 may also comprise any combination of the aforementioned dielectric materials. Note that when temperature sensitive high-k dielectric materials are employed, the second embodiment of the present invention (to be described in more detail hereinbelow) is preferably employed.

After gate dielectric 36 has been formed, gate conductor 38 is formed atop gate dielectric 36 by a conventional deposition process (such as CVD, plasma-assisted CVD, plating, sputtering and etc.) followed by planarization. Gate conductor 38 may comprise any conductive material including but not limited to: polysilicon; a conductive elemental metal such as W, Cu, Pt, Ag, Au, Ru, Ir, Rh, and Re; alloys that include at least one of the aforementioned conductive elemental metals; silicides or nitrides that include at least one of the above-mentioned conductive elemental metals; and combinations thereof may be employed. When a combination of conductive elements is employed, an optional diffusion barrier material such as TaN or WN may be formed between the conductive materials. The resultant structure that is formed after gate dielectric 36 and gate conductor 38 have been formed is shown, for example, in FIG. 11. Note that gate dielectric 36 and gate conductor 38 define the gate region of the inventive structure.

A highly preferred conductive material employed as gate conductor 38 is polysilicon since polysilicon gate conductor's lead to a fully-depleted MOSFET structure with a very low off-current. When a polysilicon gate conductor is employed, the polysilicon gate conductor is formed by deposition, planarization, ion implantation and annealing. The annealing conditions used at this point of the present invention in forming the polySi gate conductor may vary. Exemplary annealing conditions that may be employed in the present invention include: 1050° C. for 5 seconds.

Figure 12:
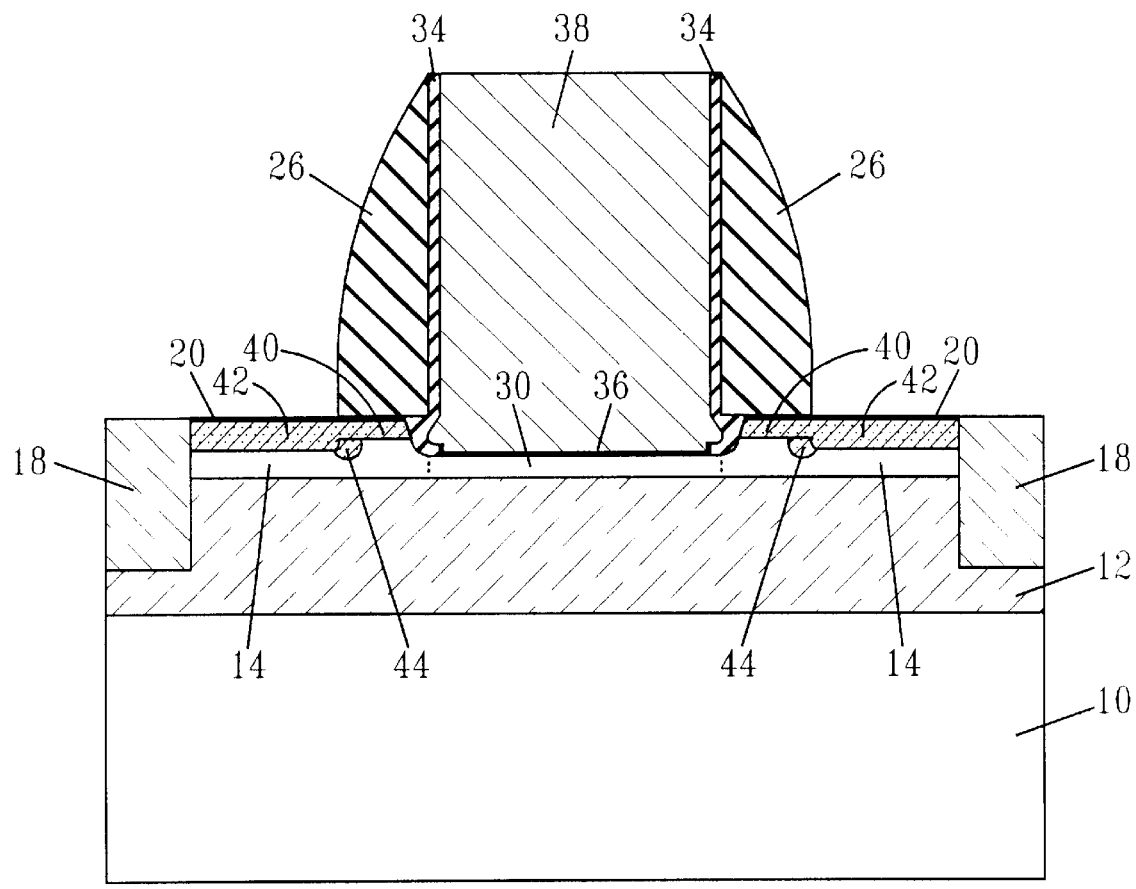

Reference is now made to the structure shown in FIG. 12 which is formed after the following processing steps have been carried out: First, oxide layer 28 is removed from the structure using an etching process that is highly selective in removing oxide. Note that SOI layer 14 abutting thinned device channel region 30 is exposed after this step of the present invention. If not previously performed, and in the case when the gate dielectric is not a temperature sensitive high-k dielectric, extension implant regions, halo implant regions and source/drain regions may now be formed utilizing conventional ion implantation processes followed by an annealing step.

The extension implants and halo implants are optional; therefore those implants may not be performed. Note that in FIG. 12 reference numeral 40 denotes extension implant regions, reference numeral 42 denotes source/drain regions and reference numeral 44 denotes the halo implant regions. Following the various implants, the implants are activated by annealing using conditions well known to those skilled in the art. For example, the implant regions may be annealed at 1000° C. for 1 second or longer. For clarity, the various implant regions are not specifically shown in the remaining drawing of the first emobodiment.

At this point of the present invention, raised source/drain regions (not shown) may be optionally formed atop the surface of the source/drain regions by epitaxially growing an epi Si layer thereon. To either the raised source/drain regions or to the previously formed source/drain regions, salicide regions 46 may be formed using a conventional salicidation process that includes, for example, forming a refractory metal such as Ti, Co or Ni on Si surfaces; heating the structure to form silicide regions and thereafter removing any non-reactive metal that was not converted into a silicide during the heating process. The resultant structure including salicide regions 46 (self-aligned silicide) is shown, for example, in FIG. 13.

Note that when the gate conductor is polysilicon, a salicide region is formed in the upper exposed portion of the polysilicon gate conductor unless appropriate steps (such as block mask formation) are taken to prevent the formation of a salicide region in the polysilicon gate conductor.

Figure 13:
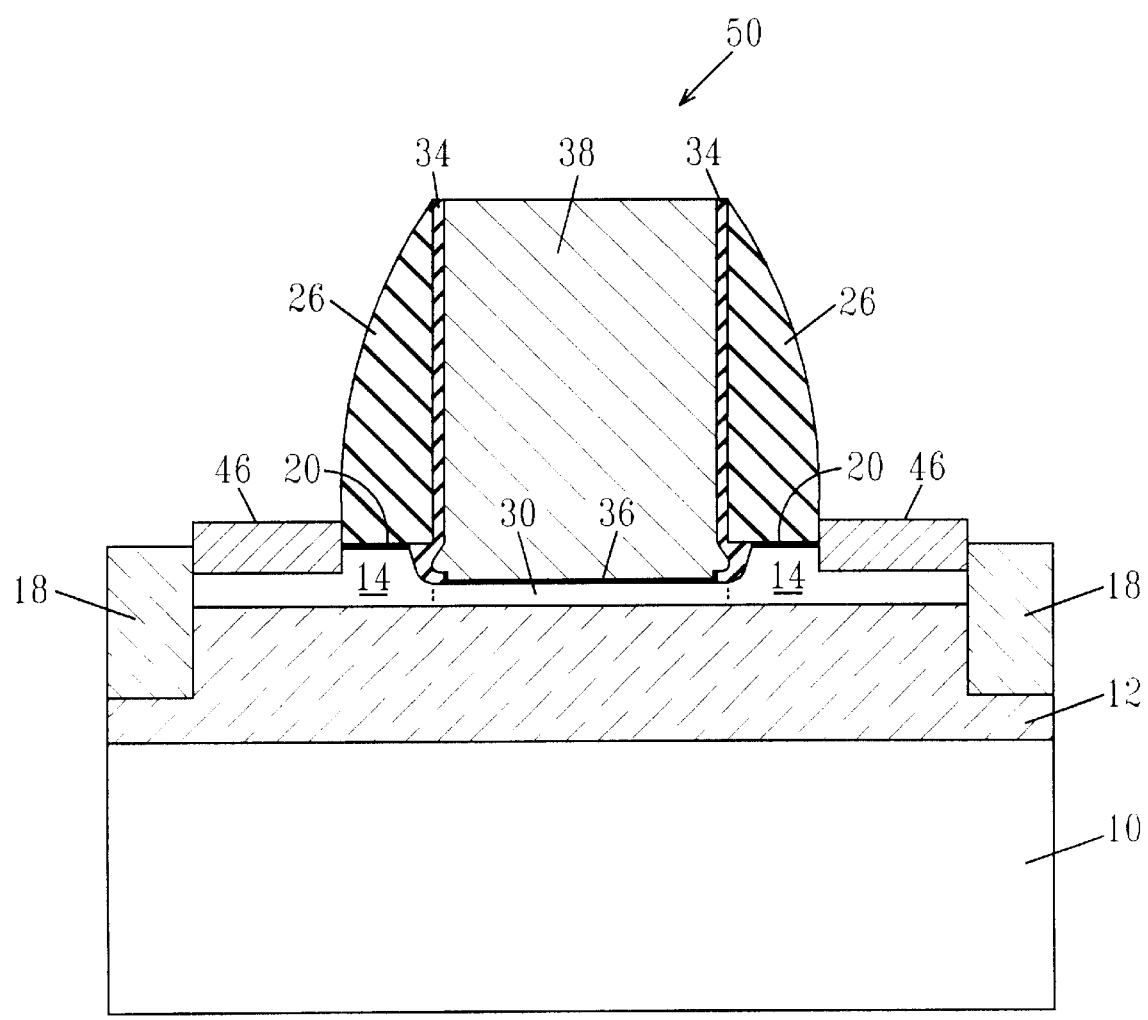

The structure shown in FIG. 13 includes an SOI structure that comprising bottom Si-containing layer 10, insulating layer 12 present atop Si-containing layer 10, and SOI layer 14 which includes a thinned device channel region 30 and abutting thicker source/drain regions that include a salicide region 46. A gate region 50 is present atop at least a portion of thinned device channel region 30. The gate region includes gate dielectric 36 and gate conductor 38. The structure shown in FIG. 13 also includes a pair of nitride spacers present about each vertical sidewall of the gate region. The nitride spacer pair includes a thick outer nitride spacers (i.e., first spacer) 26 and thinner inner nitride spacers 34.

The above discussion and FIGS. 1–13 describe a first embodiment of the present invention. The following discussion which makes reference to FIG. 14–23 illustrates the second embodiment of the present invention. In the second embodiment, the various implant regions are formed much earlier in the process than the first embodiment because the resultant structure typically includes a temperature sensitive high-k dielectric material.

Figure 14:
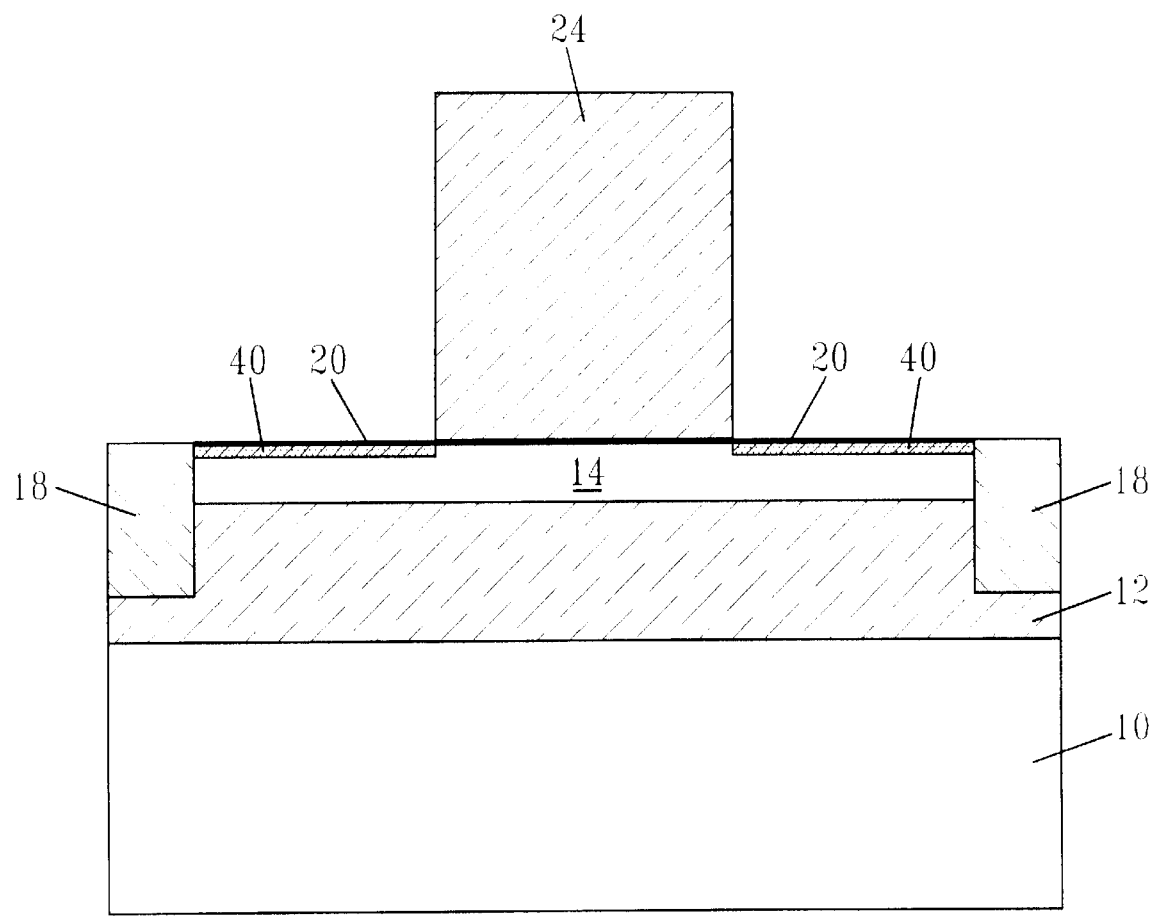
FIGS. 14–23 are cross-sectional views showing the various processing steps which are employed in another embodiment of the present invention.
Figure 15:
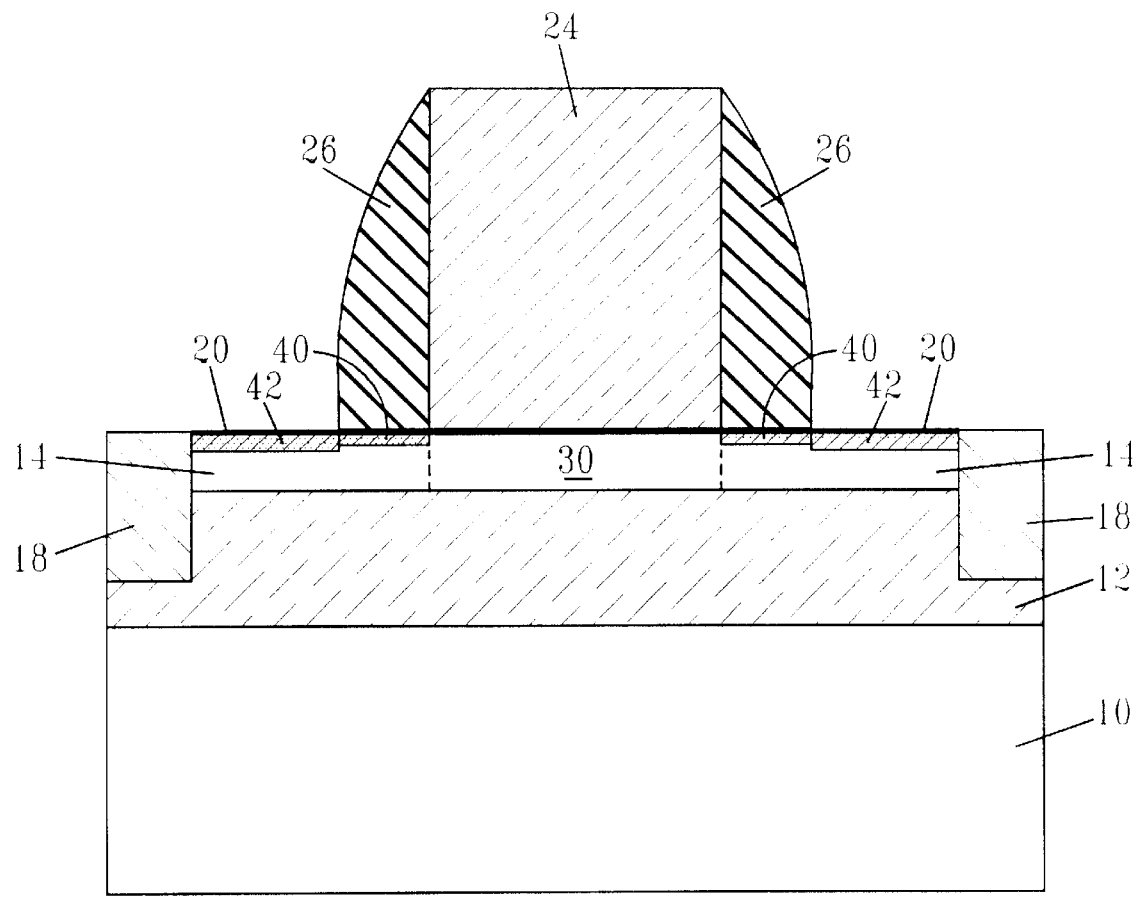
Figure 16:
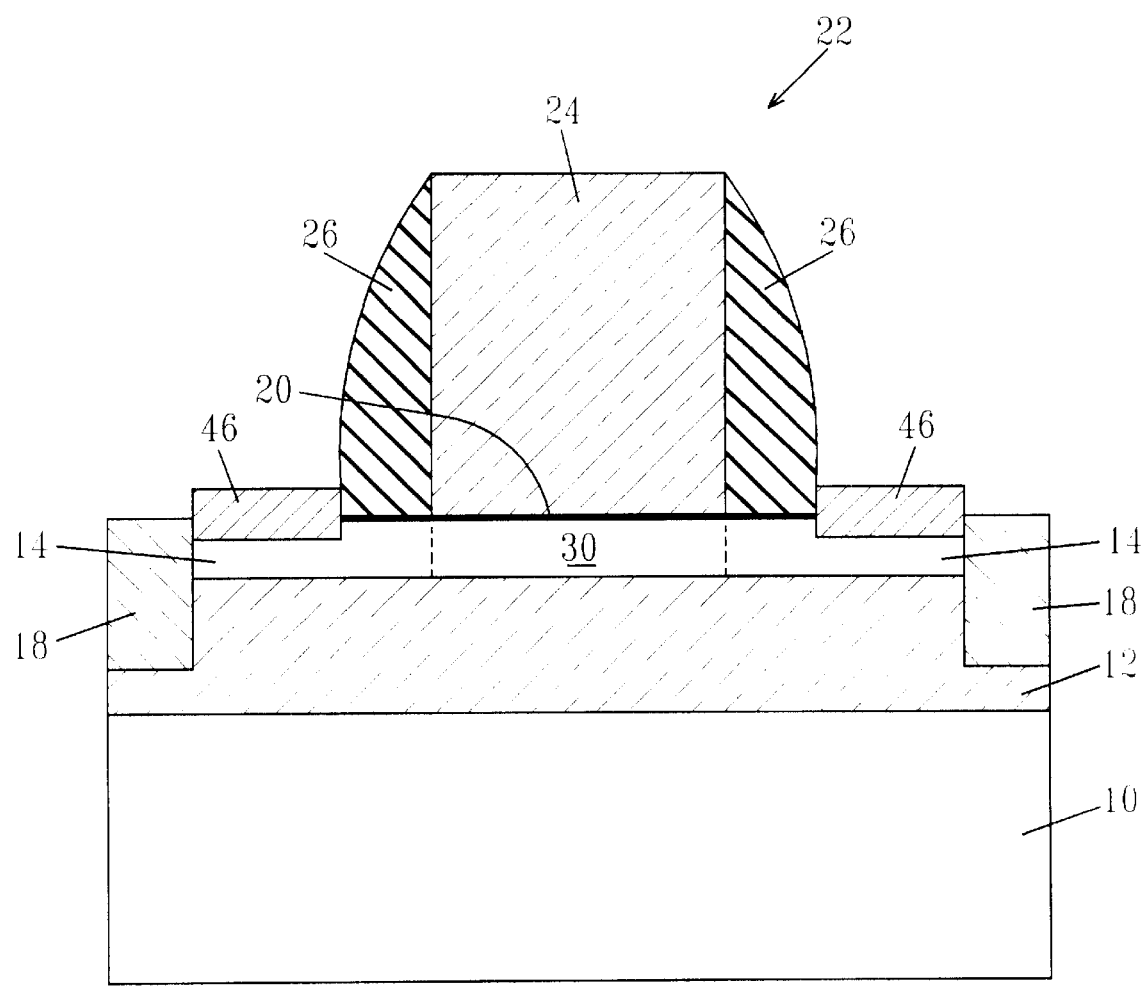
Figure 17:
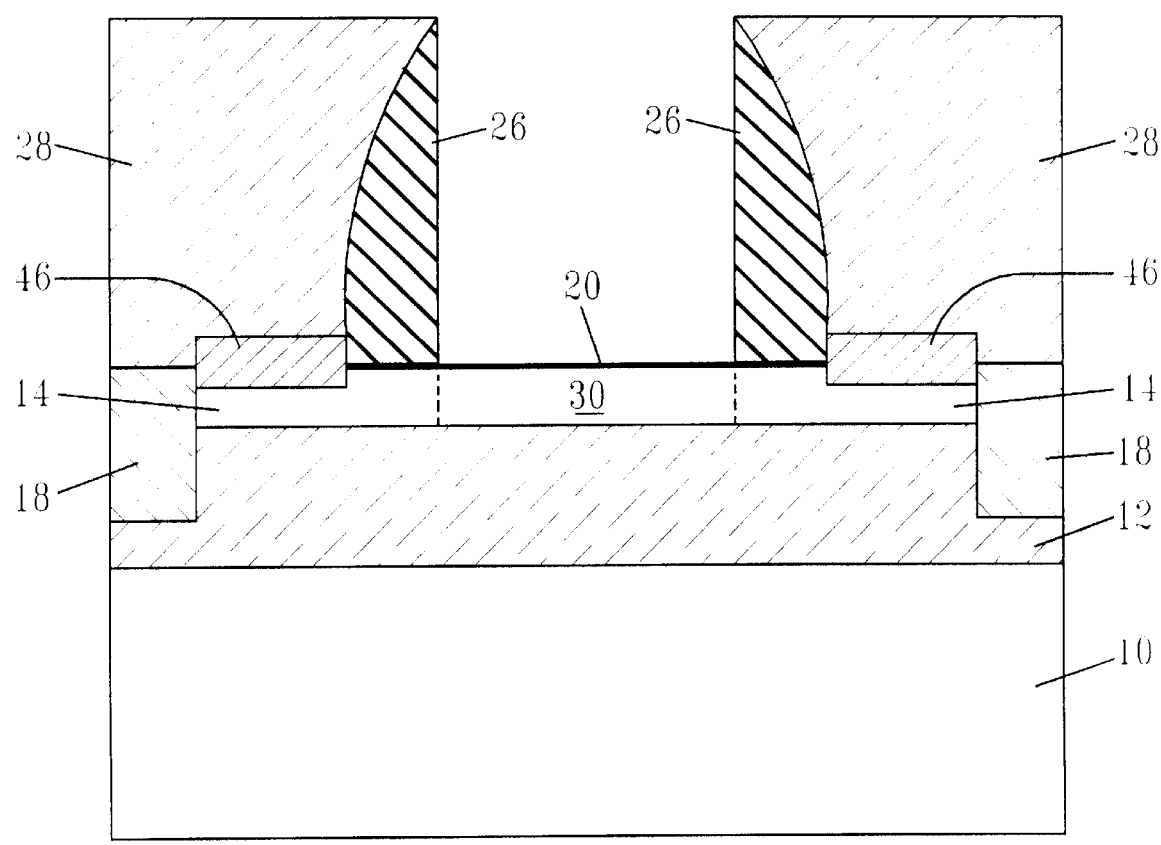
Figure 18:
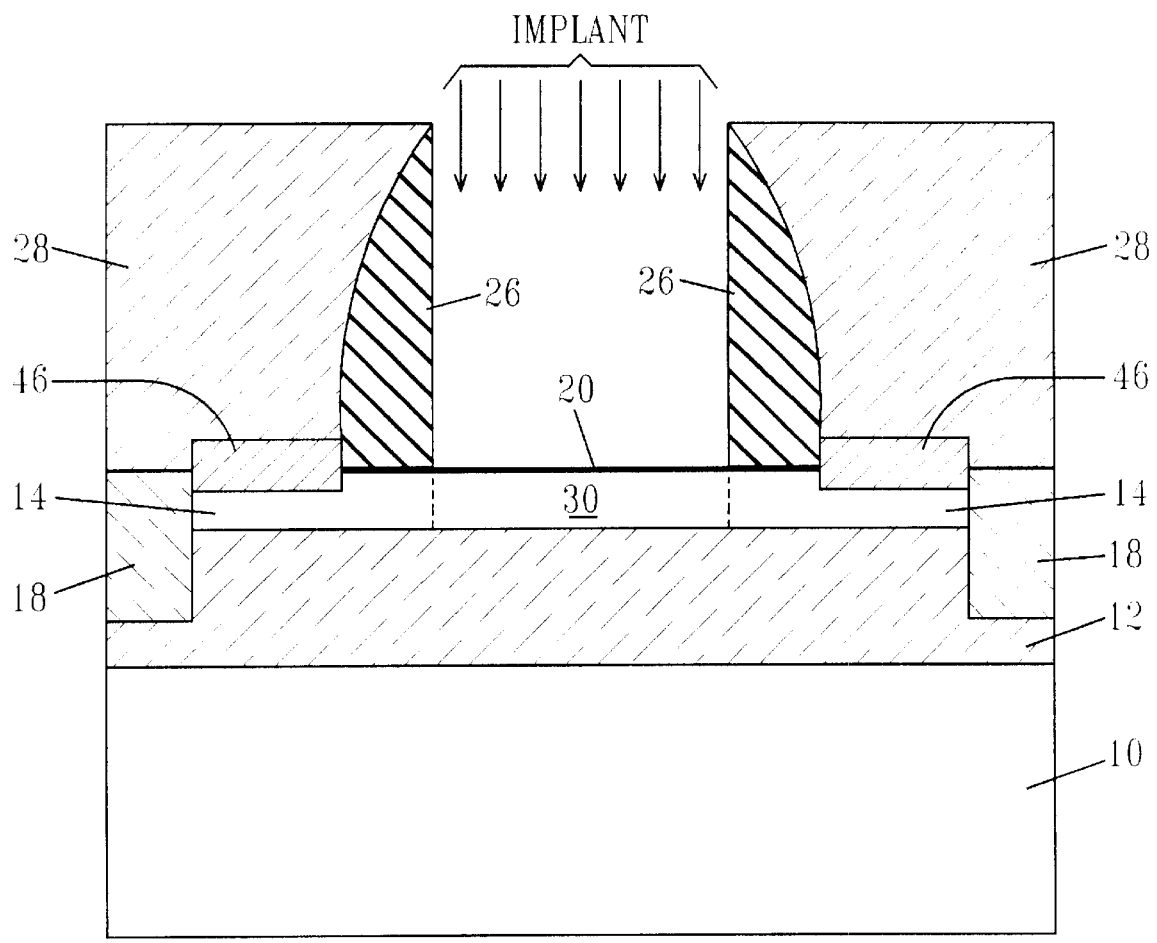

The second embodiment of the present invention initially includes the use of the structures shown in FIGS. 1–4 therefore the above discussion concerning those drawings are incorporated herein by reference. Next, and as illustrated in FIGS. 14–15, extension implant regions 40, halo implant regions (not shown) and source/drain regions 42 may now be formed in the structure utilizing conventional ion implantation processes followed by an annealing step. The extension implants and halo implants are optional; therefore those implants may not be performed.

In accordance with the present invention, the optional extension implant regions are formed into a structure which includes sacrificial polysilicon region 24, See FIG. 14. Next, and as shown in FIG. 15, the source/drain diffusion regions and optionally the halo implant regions are formed into a structure which includes nitride spacers 26 formed about the sacrificial polysilicon region. Note that the inner edges of nitride spacers 26 define device channel 30. For clarity, the various implant regions illustrated in FIGS. 14 and 15 will not be shown in the remaining drawings.

At this point of the present invention, raised source/drain regions (not shown) may be optionally formed atop the surface of the source/drain regions by epitaxially growing an epi Si layer thereon. To either the raised source/drain regions or to the previously formed source/drain regions, salicide regions 46 may be formed using a conventional salicidation process that includes, for example, forming a refractory metal such as Ti, Co or Ni on Si surfaces; heating the structure to form silicide regions; and thereafter removing any non-reactive metal that was not converted into a silicide during the heating process. The resultant structure including salicide regions 46 (self-aligned silicide) is shown, for example, in FIG. 16.

Since region 24 is comprised of polysilicon, a salicide region is formed in the upper exposed portion of the polysilicon unless appropriate steps (such as block mask formation) are taken to prevent the formation of a salicide region in this polysilicon region.

After the various implant regions and salicide regions have been formed, oxide layer 28 is deposited and planarized so as to be coplanar with an upper surface of dummy gate region 22. Next, sacrificial polysilicon region 24 of dummy gate region 22 is removed from the structure using chemical downstream etching or KOH stopping atop sacrificial oxide layer 20. The resultant structure that is formed after these steps have been performed is shown, for example, in FIG. 17

At this point of the inventive method, device channel (i.e., body region) 30 may be optionally subjected to ion implantation and annealing using conditions that are well known to those skilled in the art. The structure showing the implanting into device channel 30, is shown, for example, in FIG. 18.

Figure 19:
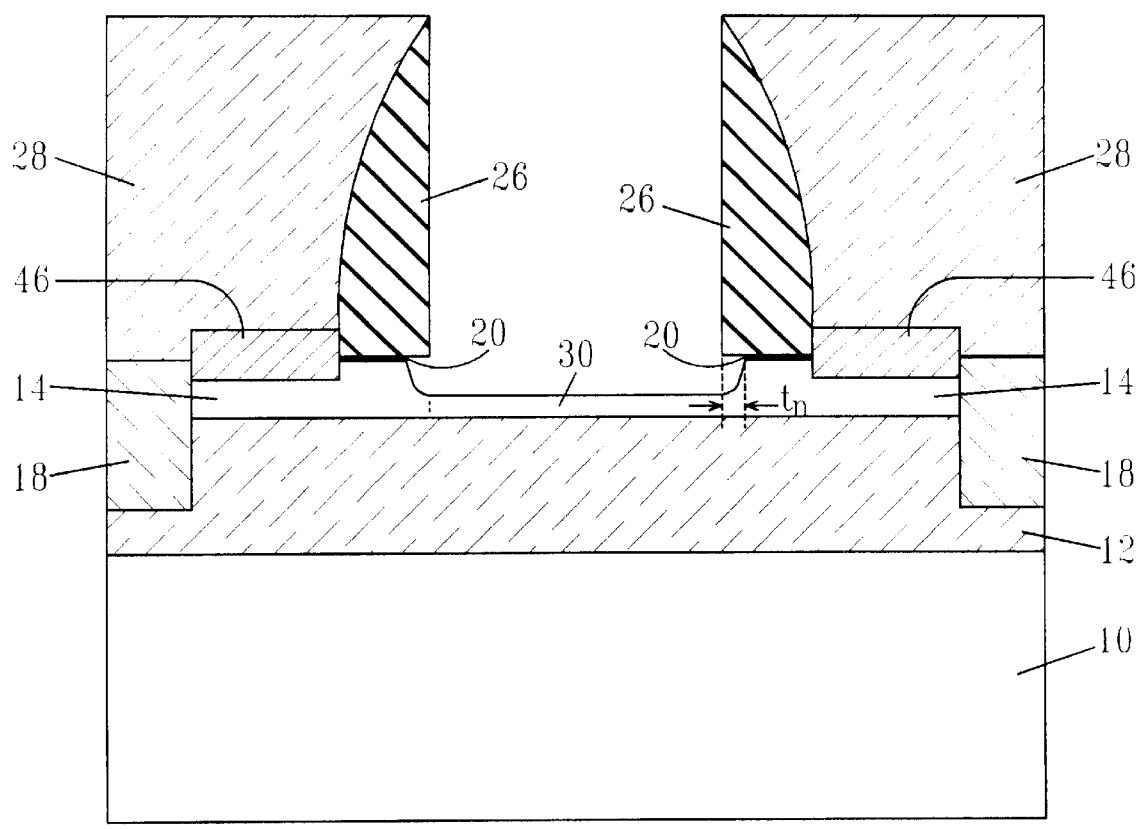

Next, device channel 30 is thinned to a thickness that is less than the thickness of the abutting SOI layer. The resultant structure including the thinned device channel, i.e., recessed channel, is illustrated in FIG. 19. The thinning of the device channel may be performed using the previously techniques mentioned above.

Figure 20:
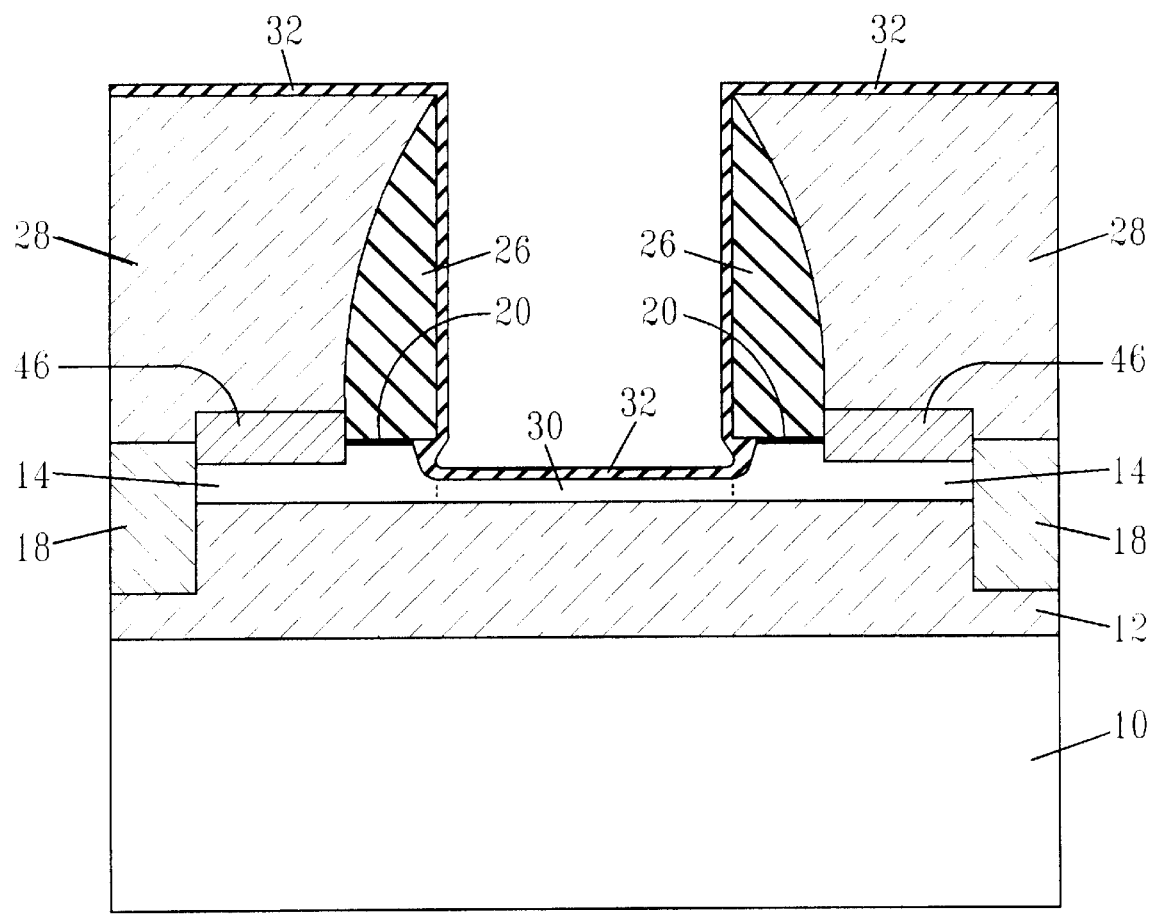
Figure 21:
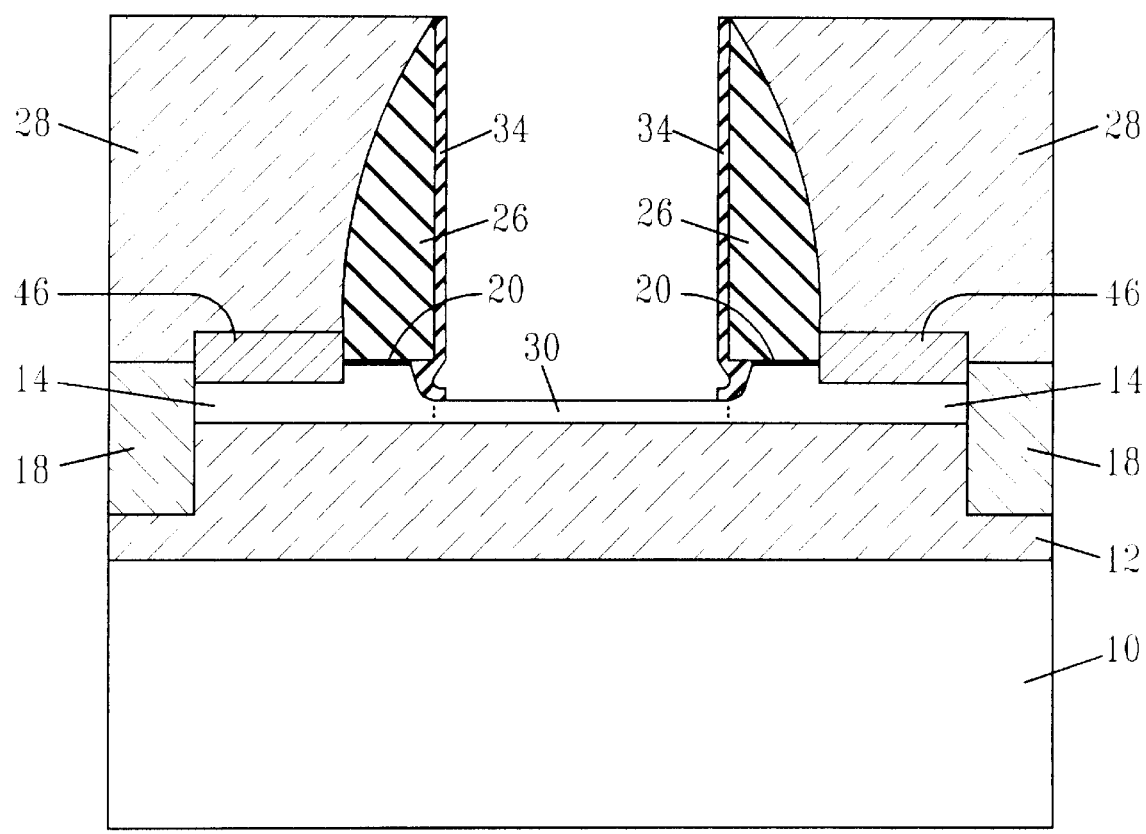
Figure 22:
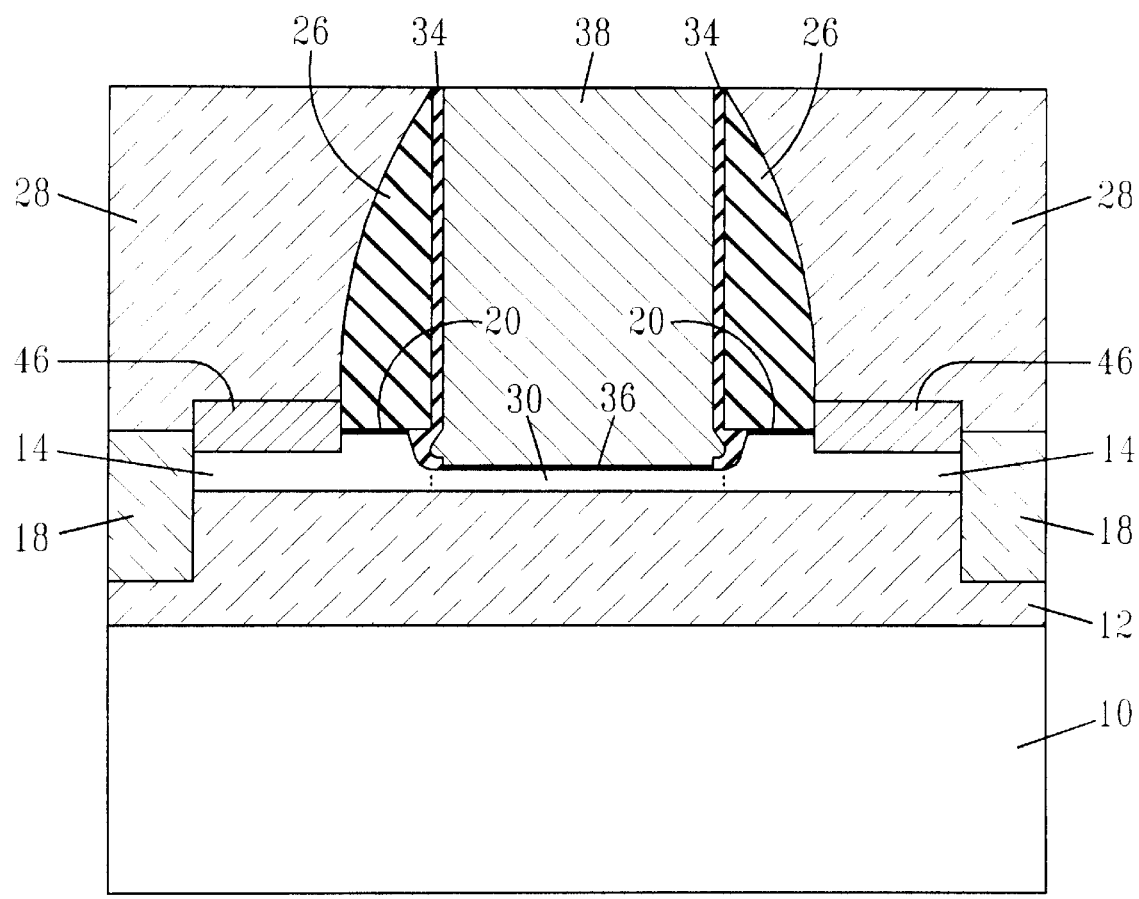

FIG. 20 shows the structure after nitride liner 32 has been deposited on the exposed horizontal and vertical surfaces of the structure shown in FIG. 19; and FIG. 21 shows the resultant structure after the nitride liner has been removed from the horizontal surfaces forming nitride inner spacers 34. After forming the nitride inner spacers, the exposed surface of thinned device channel region 30 is subjected to a thermal oxidation process and thereafter a chemical oxide removal (COR) process that is carried out at relatively low pressures (6 millitorr or less) in a vapor of HF and $NH_3$ is employed.

Next, gate dielectric 36 is formed atop the thinned device channel region utilizing a conventional deposition process. Alternatively, gate dielectric 36 may be may be composed of any dielectric material including, but not limited to: temperature sensitive high-k dielectrics such as $TiO_2$, $Al_2O_3$, $ZrO_2$, $HfO_2$, $Ta_2O_5$, $La_2O_3$; and other like including perovskite-type oxides. Gate dielectric may also comprise any combination of the aforementioned dielectric materials. A preferred gate dielectric employed in the second embodiment is a temperature sensitive high-k material. In addition to the above types of gate dielectric materials, the second embodiment of the present invention also contemplates the use of typical gate dielectrics such as $SiO_2$; $Si_3N_4$; and SiON.

After gate dielectric 36 has been formed, gate conductor 38 is formed atop gate dielectric 36 using the materials and processes mentioned previously in the first embodiment of the present invention. The resultant structure that is formed after gate dielectric 36 and gate conductor 38 have been formed is shown, for example, in FIG. 22. It is noted that metal gate conductors are preferred over polySi gate conductors in this embodiment of the present invention. Despite this preference in gate conductors, polySi gates can be employed providing that the annealing temperature used in forming the same is kept low so as not to adversely affect the temperature sensitive high-k dielectric.

Figure 23:
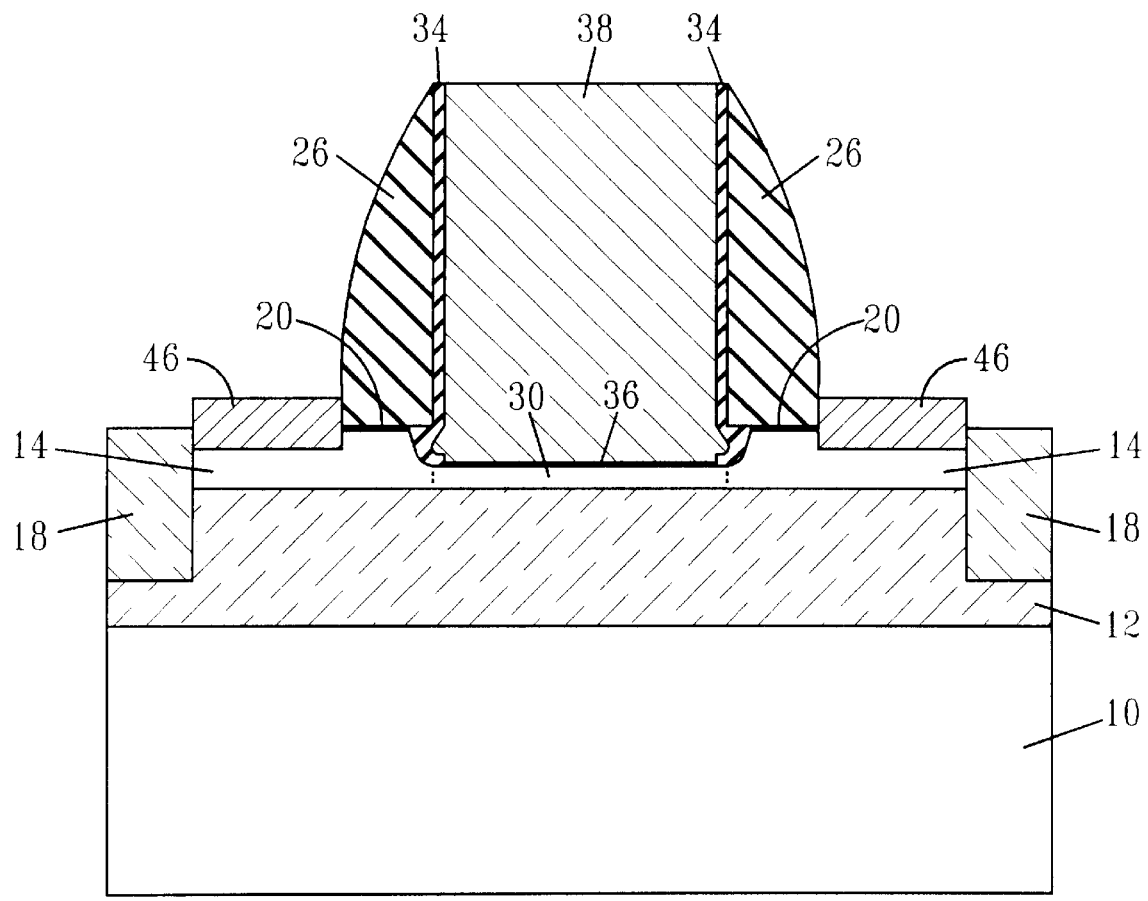

In some embodiments, normal BEOL processing may be now performed, or alternatively, oxide layer 28 may be removed providing the structure shown, for example, in FIG. 23. Note that the thick SOI regions containing at least the source/drain regions are exposed after this step of the present invention. At this point of the present invention, and if not previously been done, raised source/drain regions (not shown) may be optionally formed atop the surface of the source/drain regions by epitaxially growing an epi Si layer thereon.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

Having thus described our invention in detail, what we claim as new and desire to secure by the Letters Patent is:

1. A method of forming a sub-0.05 $\mu$m channel length fully-depleted silicon-on-insulator (SOI) metal oxide semiconductor field effect transistor (MOSFET) device comprising the steps of:

forming at least one dummy gate region atop a silicon-on-insulator (SOI) layer, said dummy gate region comprising at least a sacrificial polysilicon region and first nitride spacers located on sidewalls of said sacrificial polysilicon region;

forming an oxide layer that is coplanar with an upper surface of said dummy gate region;

removing said sacrificial polysilicon region to expose a portion of the SOI layer;

forming a thinned device channel region by utilizing at least an etching step in said exposed portion of the SOI layer, said etching step comprising chemical down stream etching, reactive ion etching or thermal oxidation and reactive-ion etching;

forming inner nitride spacers on exposed walls of said first nitride spacers;

forming a gate region over said thinned device channel region; and removing said oxide layer so as to expose thicker portions of said SOI layer than said device channel region.

2. The method of claim 1 wherein said sacrificial polysilicon region is removed using chemical downstream etching or a KOH etchant.

3. The method of claim 1 wherein said forming of said thinned device channel region further comprises implantation and annealing which are performed prior to the etching step.

4. The method of claim 1 wherein said inner nitride spacers are formed by deposition and etching.

5. The method of claim 1 wherein said thinned device region is subjected to a thermal oxidation and chemical oxide removal (COR) process prior to forming said gate region.

6. The method of claim 5 wherein said COR process is carried out at a pressure of about 6 millitorr or less in a vapor of HF and $NH_3$.

7. The method of claim 1 further comprising a step of forming at least source/drain regions into said SOI layer in regions adjacent to said thinned device channel region.

8. The method of claim 7 wherein said source/drain regions are formed during formation of the dummy gate region.

9. The method of claim 7 wherein said source/drain regions are formed after said oxide layer has been removed.

10. The method of claim 1 further comprising forming salicide regions on said thicker portions of said SOI layer.

* * * * *